United States Patent [19]

Sawada et al.

[11] 4,433,911
[45] Feb. 28, 1984

[54] METHOD OF EVALUATING MEASURE PRECISION OF PATTERNS AND PHOTOMASK THEREFOR

[75] Inventors: Shizuo Sawada; Mitsugi Ogura; Norio Endo, all of Yokohama, Japan

[73] Assignee: Tokyo Shibaura Denki Kabushiki Kaisha, Japan

[21] Appl. No.: 391,297

[22] Filed: Jun. 23, 1982

[30] Foreign Application Priority Data

Jun. 30, 1981 [JP] Japan ............................ 56-101600

[51] Int. Cl.³ ...................... G03B 27/28; G01B 11/00
[52] U.S. Cl. ........................................ 355/125; 354/4; 355/52; 355/77; 356/394
[58] Field of Search ................ 355/71, 77, 125, 52; 354/1, 4; 356/71, 381, 382, 384, 388, 394, 397

[56] References Cited

U.S. PATENT DOCUMENTS

| | | | |
|---|---|---|---|
| 3,716,296 | 2/1973 | Springer et al. | 355/77 X |
| 3,861,798 | 1/1975 | Kobayashi et al. | 355/77 X |
| 3,942,896 | 3/1976 | Schneider et al. | 356/384 X |
| 3,963,354 | 6/1976 | Feldman et al. | 356/394 |
| 3,976,383 | 8/1976 | Olsen | 356/394 X |
| 4,005,939 | 2/1977 | Stavalone | 356/394 |
| 4,183,659 | 1/1980 | Brunner | 355/77 X |
| 4,288,157 | 9/1981 | Brunner | 355/77 X |
| 4,349,278 | 9/1982 | French et al. | 356/384 X |

FOREIGN PATENT DOCUMENTS 4505 10/1979 European Pat. Off. ............ 356/394

OTHER PUBLICATIONS

IBM Tech. Disclosure Bulletin, "Tooling & Method for Inspection of Glassmaster Grid Locations", vol. 22, No. 6, Nov. 1979, L. D. Mayes & N. G. Stevens, pp. 2263-2264.

Primary Examiner—Richard A. Wintercorn
Attorney, Agent, or Firm—Finnegan, Henderson, Farabow, Garrett & Dunner

[57] ABSTRACT

A method for evaluating the measure precision of patterns such as photoresist and etched ones, and a photomask therefor. The photomask according to the present invention has a mask pattern corresponding to a pattern desired to be formed in a substrate, and also has a measure precision evaluating pattern formed at an area different from where the mask pattern is present. The measure precision evaluating pattern comprises a first measure precision evaluating pattern which has a plurality of pairs of pattern elements opposite to each other with a predetermined distance interposed therebetween, and a second measure precision evaluating pattern which has a plurality of pairs of pattern elements overlapped each other in a predetermined measure and arranged opposite to each other to form a constricted portion. The distance or the measure of overlapped area between paired pattern elements is varied with every pair of pattern elements. This mask pattern is transcribed onto the substrate and a pair of pattern elements contacting each other without overlapping is found from the transcribed pattern. Dimensional change is found from the distance or the measure of overlapped area between the pair of photomask pattern elements corresponding to that pair of pattern elements which has been found from the transcribed pattern.

15 Claims, 10 Drawing Figures

METHOD OF EVALUATING MEASURE PRECISION OF PATTERNS AND PHOTOMASK THEREFOR

BACKGROUND OF THE INVENTION

I. Field of the Invention

The present invention relates to a method of evaluating the dimension accuracy of patterns such as photoresist patterns and etching patterns formed during the process of manufacturing semiconductor devices, for example. The present invention also relates to a photomask used for the method.

II. Description of the Prior Art

Photo-engraving process is a technique widely used in the process of manufacturing various kinds of semiconductor devices. This technique includes a step of exposing to light a photoresist layer formed on a semiconductor substrate through a photomask which has a desired pattern to be formed. When the photoresist layer exposed to light is developed, a resist pattern is obtained corresponding to the pattern of the photomask. Layers such as Si or $SiO_2$ under the resist pattern are etched with appropriate etching means using the resist pattern as a mask, then a pattern etched as desired is obtained.

It is extremely important for the high precision of semiconductor device that the dimension of pattern formed by the photo-engraving process is just as set. It becomes therefore necessary to evaluate the measure precision of photoresist pattern and/or etched pattern formed by the photo-engraving process.

The micrometer (or microscope) has been widely used to measure the dimension of pattern. In the case of this method, however, the dimension to be measured becomes different depending upon the manner of focusing the microscope. Therefore, this method causes measuring error to be made large and is far from establishing absolute evaluation of pattern dimension.

Alternative is to measure the dimension of pattern in such a way that a sample is subjected to laser beam and its reflected beam is monitored. However, values measured according to this method are substantially influenced by the sectioned contour of the object to be measured. This method is therefore suitable for measuring relative dimension but not for measuring absolute dimension.

There are many other methods of measuring the dimension of pattern but they are not necessarily satisfactory. A method of most accurately measuring absolute dimension is achieved using the scanning electromicroscopy (SEM). However, this method makes it necessary to prepare a measuring sample and causes the in-process monitoring of pattern to be made troublesome and complicated.

SUMMARY OF THE INVENTION

An object of the present invention is therefore to provide a method of evaluating the measure precision of patterns, which is capable of easily and reliably evaluating the dimension accuracy of, for example, photoresist or etched patterns formed in the process of manufacturing semiconductor devices, or other patterns.

Another object of the present invention is to provide a photomask employed in the course of carrying out the above-mentioned method.

The photomask according to the present invention includes a plurality of paired pattern elements arranged opposite to each other with a predetermined distance interposed therebetween. The distance between paired pattern elements is varied, 0.2 $\mu$m for example, with every paired pattern elements. This is a first pattern for evaluating the dimension of transcribed pattern. The photomask according to the present invention further includes a plurality of paired pattern elements so arranged as to overlap each other in a predetermined measure to form a constricted portion. The measure where paired pattern elements are overlapped each other is varied, 0.2 $\mu$m for example, with every paired pattern elements. This is a second pattern for evaluating the dimension of transcribed pattern. Of course, the photomask according to the present invention has a mask pattern for manufacturing a semiconductor device and the like, in addition to first and second patterns for evaluating the dimension of transcribed pattern.

According to the method of the present invention, the photoresist is exposed to light through the photomask to form in the substrate a pattern corresponding to that of this photomask. A pair of pattern elements which contact each other without overlapping is then found out from the pattern transcribed onto the substrate. The dimensional change is to be known from the distance between paired photomask pattern elements corresponding to the pair of transcribed pattern elements thus found out or from the overlapping dimension of the paired photomask pattern elements corresponding to the pair of transcribed pattern elements thus found out. For example, when the distance between paired photomask pattern elements corresponding to the pair of transcribed pattern elements which contact each other without overlapping is 0.2 $\mu$m, it can be found that the pattern formed in the substrate is 0.2 $\mu$m larger than the photomask pattern. If the photomask pattern is transcribed onto the substrate just as its dimension, the distance of the transcribed paired pattern elements is also 0.2 $\mu$m. However, the paired pattern elements actually transcribed on the substrate contact each other without overlapping. This means that the transcribed pattern is formed 0.2 $\mu$m larger than the photomask pattern. Contrary, when the photomask pattern elements corresponding to the thus found out pair of pattern elements formed in the substrate overlap each other by 0.2 $\mu$m, it can be found that the pattern transcribed onto the substrate is formed 0.2 $\mu$m smaller than the photomask pattern.

As described above, the method according to the present invention enables the dimension accuracy of resist, etched or other pattern to be easily and reliably evaluated without using such particular measuring device as SEM used in the conventional methods.

DETAILED DESCRIPTION OF THE PREFERRED EMBODIMENTS

Figure 1:
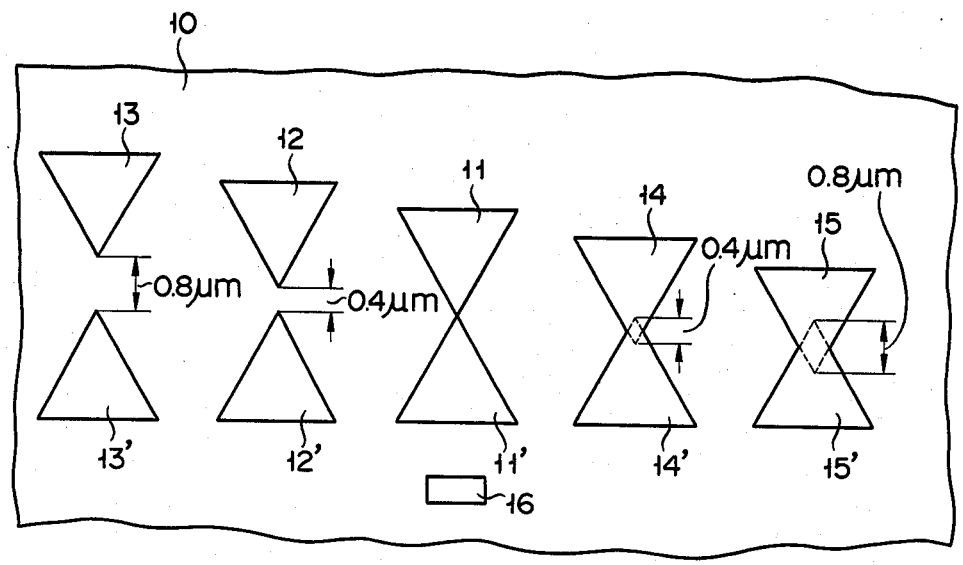
FIG. 1 shows an example of pattern for evaluating the measure precision, which is formed in the photomask according to the present invention.

A photomask 10 according to the present invention has a photomask pattern corresponding to a desired pattern to be formed in a substrate and also has such a pattern as shown in FIG. 1, for example, at an area different from where the photomask pattern is present. The latter pattern is for evaluating the measure precision of the pattern transcribed on a substrate. As shown in FIG. 1, the measure precision evaluating pattern includes a pair of pattern elements 11 and 11' zero-spaced opposite to each other, that is, contacting each other without overlapping. This is standard pair of pattern elements, and adjacent to which is present a pattern 16 for indicating the standard pattern elements pair 11-11'. A plurality (two pairs in FIG. 1) of paired pattern elements 12-12' and 13-13' are formed in the left region of the standard pair 11-11'. The pattern elements of each pair is arranged opposite to each other with a predetermined distance interposed therebetween. The distance between pattern elements of each pair is varied with every pair and they are 0.4 $\mu$m and 0.8 $\mu$m in FIG. 1. Paired pattern elements 14-14' and 15-15', pattern elements of each pair facing and overlapping each other by a predetermined dimension, are also present on the right side of the standard pair 11-11'. The overlapped portion of paired pattern elements forms a constricted portion. The overlapped dimension of paired pattern elements is varied with every pair and they are 0.4 $\mu$m and 0.8 $\mu$m in FIG. 1.

The photomask pattern thus arranged is transcribed on a substrate. The transcription includes a step of selectively exposing a photoresist layer formed on the substrate to light through the photomask and developing it. The pattern evaluated by the method of the present invention may be a resist pattern thus formed or a pattern etched with appropriate etching means using the resist pattern as a mask.

Figure 2:
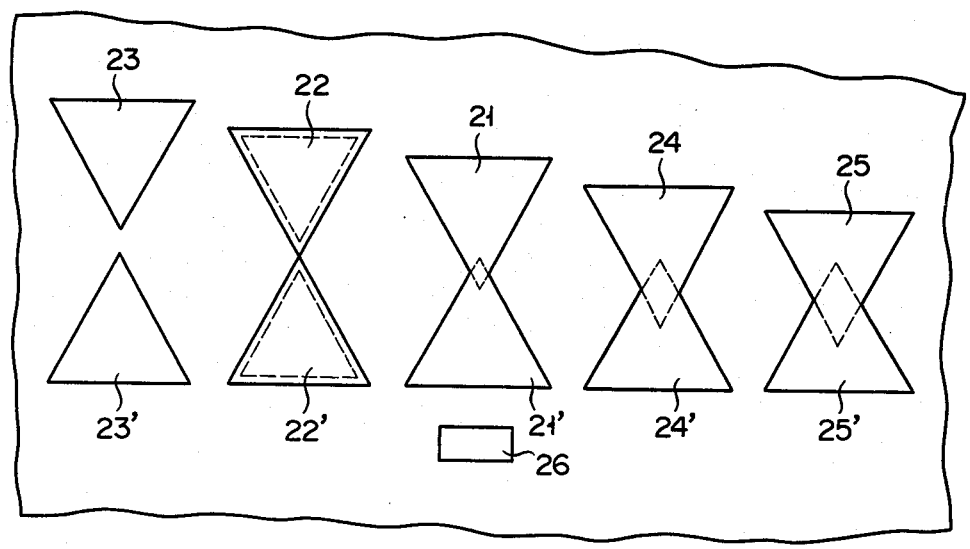
FIG. 2 shows an example of pattern which may be obtained by transcribing the photomask pattern of FIG. 1.

When the pattern is formed in the substrate using the above-described photomask, the pattern corresponding to the measure precision evaluating pattern is also formed in the substrate. It is assumed that a pattern shown in FIG. 2 is formed in the substrate. Using a microscope, a pair of pattern elements contacting each other without overlapping is sought out from the transcribed pattern. In FIG. 2, paired pattern elements 22-22' contact each other without overlapping. It is photomask pattern elements pair 12-12' that is corresponding to the pattern elements pair 22-22'. It can be immediately found that paired pattern elements 22-22' correspond to paired pattern elements 12-12', because paired pattern elements 22-22' are next to a pattern 26 for indicating the standard pair of pattern elements. Paired photomask pattern elements 12-12' are spaced 0.4 $\mu$m from each other. However, when the elements pair 12-12' is transcribed onto the substrate, the corresponding paired pattern elements 22-22' becomes to contact each other without overlapping. It can be found therefore that the pattern formed in the substrate is 0.4 $\mu$m larger as the whole of paired pattern elements than the photomask pattern. (Broken lines in pattern elements 22 and 22' in FIG. 2 represent patterns when the photomask pattern is transcribed just as it is. The distance between broken and solid lines becomes 0.2 $\mu$m.)

When paired pattern elements 24-24' formed in the substrate contact each other without overlapping, it can be found that the pattern formed in the substrate is 0.4 $\mu$m smaller as the whole of paired pattern elements than the photomask pattern. Only five pairs of pattern elements are formed in this example for the clarity of description, but dimension evaluation can be achieved with more accuracy when the number of paired pattern elements is increased with the distance and the overlapped measure of each paired elements being varied.

A more preferable pattern for evaluating the measure precision of pattern being formed in the photomask of the present invention will be described below.

Figure 3:
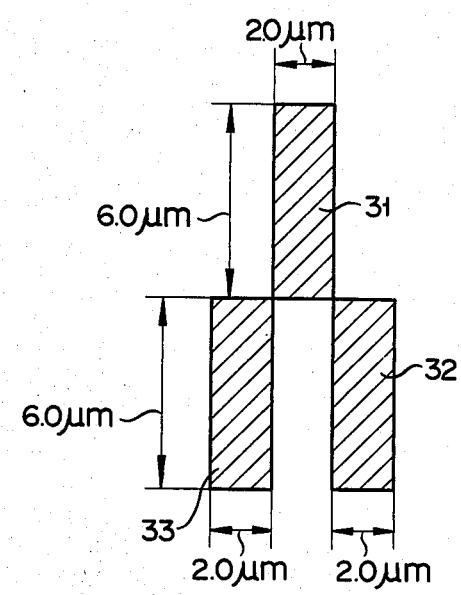
FIG. 3 shows a pattern formed in a photomask.

There is considered a case where a pattern shown in FIG. 3, for example, is formed in the photomask. This pattern comprises three rectangular pattern elements 31, 32 and 33, each being 6.0 $\mu$m long and 2.0 $\mu$m wide. The lower right corner of pattern element 31 contacts the upper left corner of pattern element 32 without overlapping. The lower left corner of pattern element 31 contacts the upper right corner of pattern element 33 without overlapping. As the result, the lower side of upper pattern element 31 is aligned with upper sides of lower pattern elements 33 and 32 on a straight line.

Figure 4:
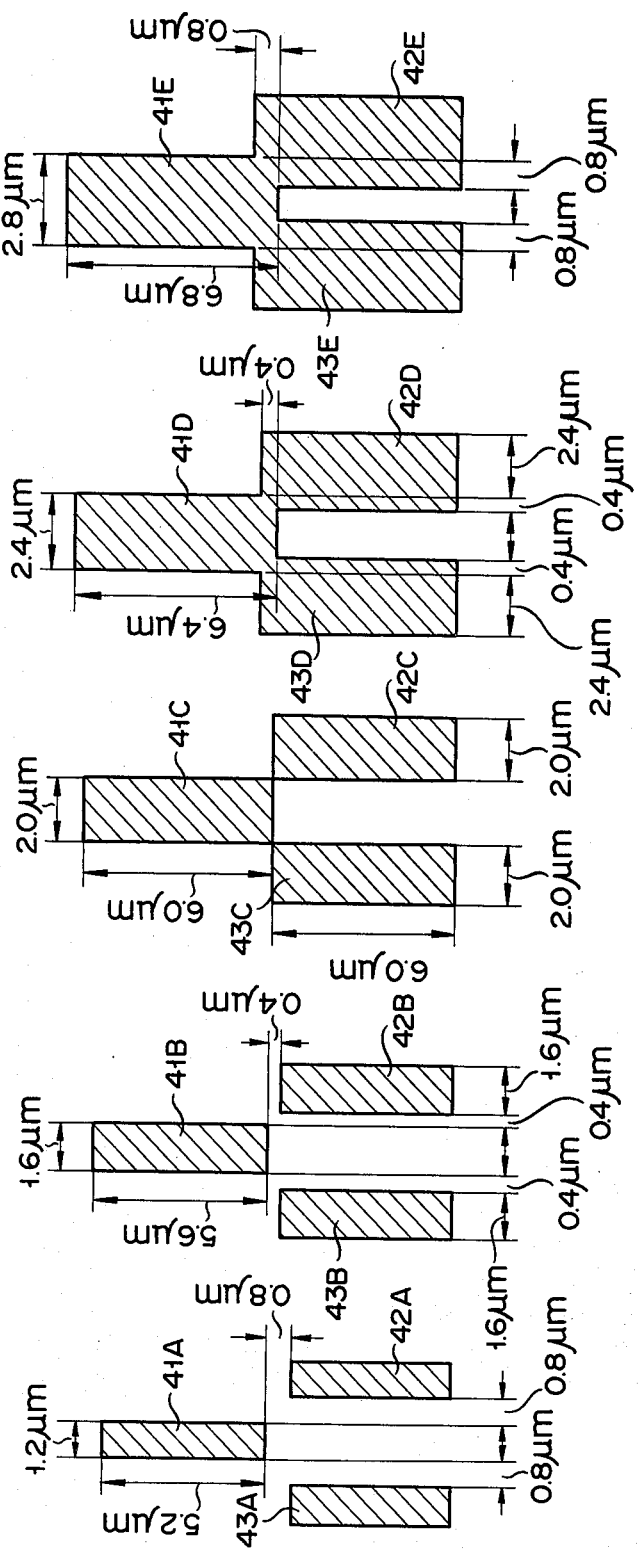
FIGS. 4A to 4E show various patterns which may be formed in a substrate by transcribing the photomask pattern of FIG. 3.

When this photomask pattern is transcribed onto a substrate and a pattern having just same dimension as that of photomask pattern is formed in the substrate, the pattern will be as shown in FIG. 4C which is just same as the mask pattern in FIG. 3. When the pattern formed in the substrate is 0.4 $\mu$m smaller than the mask pattern, however, pattern elements are separated from one another as shown in FIG. 4B. The lower side of an upper pattern element 41B is separated 0.4 $\mu$m from upper sides of lower pattern elements 42B and 43B. The right side of pattern element 41B is separated 0.4 $\mu$m from the left side of pattern element 42B. The left side of pattern element 41B is also separated 0.4 $\mu$m from the right side of pattern element 43B. Similarly when the pattern in the substrate is formed 0.8 $\mu$m smaller than the mask pattern, the pattern will be as shown in FIG. 4A wherein the lower side of an upper pattern element 41A is separated 0.8 $\mu$m from upper sides of lower pattern elements 42A and 43A and the right side of upper pattern element 41A is also separated 0.8 $\mu$m from the left side of lower pattern element 42A. When the pattern in the substrate is formed 0.4 $\mu$m larger than the mask pattern, the pattern will be as shown in FIG. 4D. Namely, corners of pattern elements which contact each other at a single point without overlapping in the photomask becomes to overlap each other. The lower side of an upper pattern element 41D overlaps 0.4 $\mu$m over the upper sides of lower pattern elements 42D and 43D, and the right side of upper pattern element 41D also overlaps 0.4 $\mu$m on the left side of lower pattern element 42D. The left side of upper pattern element 41D also overlaps 0.4 $\mu$m over the right side of lower pattern element 43D. Similarly when the pattern in the substrate is formed 0.8 $\mu$m larger than the mask pattern, it will be as shown in FIG. 4E wherein the lower side of an upper pattern element 41E is overlapped 0.8 $\mu$m over the upper sides of lower pattern elements 42E and 43E, and the right side of upper pattern element 41E is also overlapped 0.8 $\mu$m over the left side of lower pattern element 42E.

Thus, when the mask pattern shown in FIG. 3 is transcribed onto the substrate, dimensional changes are represented by the distance or overlapped measure between upper and lower pattern elements.

Figure 5:
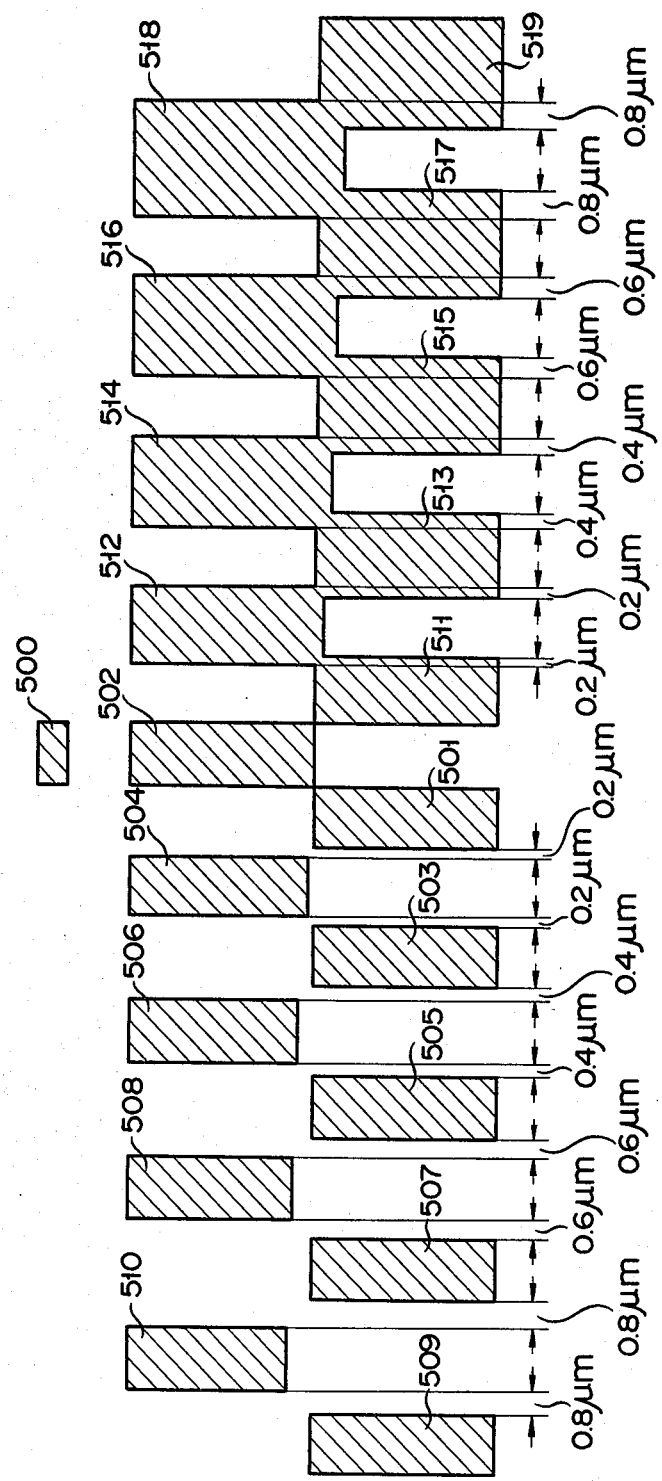
FIG. 5 shows another pattern for evaluating the measure precision, which is formed in the photomask according to the present invention.

When a measure precision evaluating pattern shown in FIG. 5 is formed in the photomask at an area different from where the photomask pattern corresponding to a pattern desired to be formed in the substrate is present, the evaluation of pattern formed in the substrate can be easily achieved.

Pattern elements which form this measure precision evaluating pattern are rectangular. Upper pattern elements (even numbered ones of pattern elements 502–518) are aligned in a line from right to left with predetermined distances interposed therebetween. Lower pattern elements (odd-numbered ones of pattern elements 501–519) are further aligned in another line from right to left with predetermined distances interposed therebetween in such a way that the upper side of each lower pattern element is positioned in the lower portion of the gap between each upper pattern element. The lower left corner of upper pattern element 502 contacts the upper right corner of lower pattern element 501 without overlapping. The lower right corner of upper pattern element 502 contacts the upper left corner of lower pattern elements 511 at a single point without overlapping. Thus, the upper pattern element 502 forms a pair with the lower pattern element 501 also forms another pair with the lower pattern element 511. Therefore, according to this example of pattern, one pattern element forms two pairs of pattern elements with two different pattern elements.

A space is present between the lower right corner of upper pattern element 504 and the upper left corner of lower pattern element 501. The distance between the lower side of upper pattern element 504 and the upper side of lower pattern element 501 is set 0.2 $\mu$m. The right side of upper pattern element 504 is spaced 0.2 $\mu$m from the left side of lower pattern element 501. Same space is also interposed between upper and lower pattern elements 504 and 503.

A space is also present between the lower right corner of upper pattern element 506 and the upper left corner of lower pattern element 503. The space between the lower side of upper pattern element 506 and the upper side of lower pattern element 503 is arranged 0.4 $\mu$m. The space between the right side of upper pattern element 506 and the left side of lower pattern element 503 is also arranged 0.4 $\mu$m.

Similarly, upper pattern elements 506, 508 and 510 are spaced 0.4 $\mu$m, 0.6 $\mu$m and 0.8 $\mu$m from their corresponding lower pattern elements 505, 507 and 509, respectively as shown in FIG. 5.

On the contrary, the lower left corner of upper pattern element 512 is overlapped over the upper right corner of lower pattern element 511 to form a constricted portion. The lower side of upper pattern element 512 is overlapped 0.2 $\mu$m over the upper side of lower pattern element 511, and the left side of upper pattern element 512 is also overlapped 0.2 $\mu$m over the right side of lower pattern element 511. The lower right corner of upper pattern element 512 is overlapped by the same dimension with the upper left corner of lower pattern element 513 to form a constricted portion. The lower left corner of upper pattern element 514 is also overlapped over the upper right corner of lower pattern element 513 to form a constricted portion. The lower side of upper pattern element 514 is overlapped 0.4 $\mu$m over the upper side of lower pattern element 513 and the left side of upper pattern element 514 is also overlapped 0.4 $\mu$m over the right side of lower pattern element 513.

Similarly, both lower corners of each of upper pattern elements 514, 516 and 518 are overlapped over upper corners of its lower pairing pattern elements 515, 517 and 519 to form constricted portions, and their overlapped measure are 0.4 $\mu$m, 0.6 $\mu$m and 0.8 $\mu$m, respectively, as shown in FIG. 5.

A pattern 500 is formed above the upper pattern element 502 to indicate that the pattern element 502 is a standard pattern element. The reason why the upper pattern element 502 becomes a standard pattern is that its each lower corner contacts the corner of lower pattern element 511 and the corner of lower pattern element 501, respectively, at a single point without overlapping.

By using the photomask provided with this measure precision evaluating pattern, the photoresist is exposed to light to form a resist pattern corresponding to the mask pattern. How to measure the dimensional change of the photoresist pattern from the mask pattern will now be described.

Figure 6:
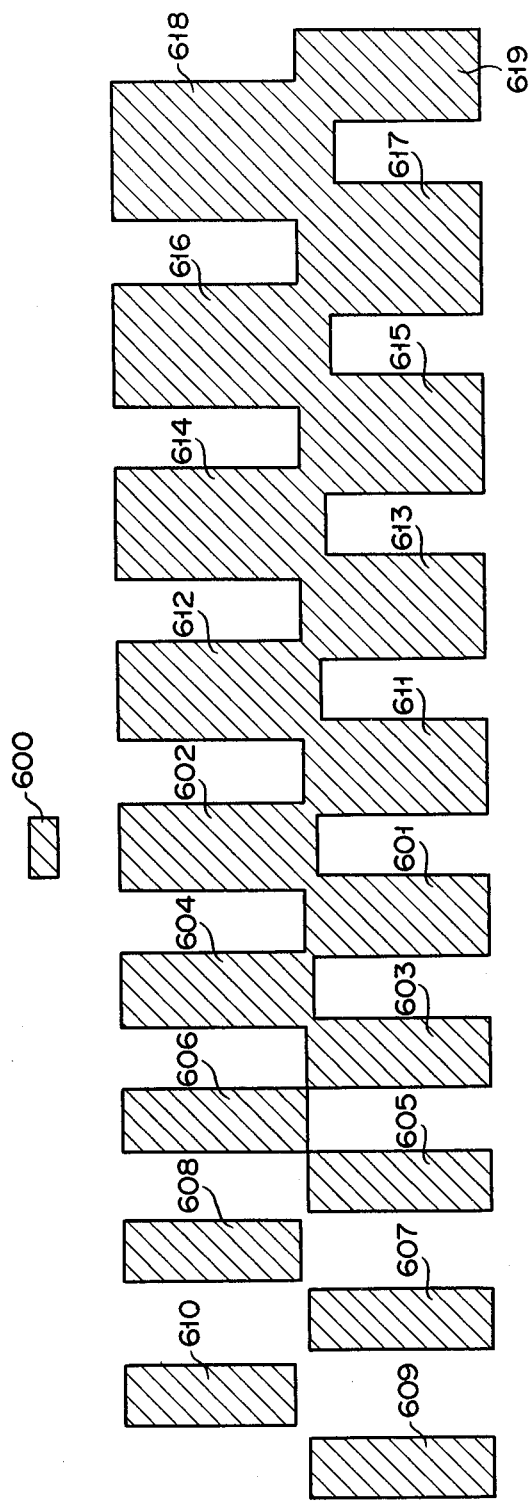
FIG. 6 shows an example of pattern which may be obtained by transcribing the photomask pattern of FIG. 5.

There is considered a case where the resist pattern formed is as shown in FIG. 6. Similarly as described referring to the example of FIG. 1, the resist pattern is searched under the microscope to find a pair of pattern elements contacting each other without overlapping. Paired pattern elements 606 and 603 contact each other at a single point without overlapping in FIG. 6. Same thing can also be said to paired pattern elements 606 and 605. Judging from the position of standard pattern element indicating pattern 600, it can be found that photomask pattern elements corresponding to these pattern elements 606, 603 and 605 are pattern elements 506, 503 and 505, respectively. As described above, the space between paired photomask pattern elements 506–503 or 506–505 is 0.4 $\mu$m. It can be therefore found that the pattern in FIG. 6 was formed 0.4 $\mu$m larger than the photomask pattern in FIG. 5.

It is also assumed that paired pattern elements contacting each other without overlapping are pattern elements 614–613 and 614–615. Judging from the position of standard pattern elements indicating pattern 600, it can be found that photomask pattern elements corresponding to these pattern elements 614, 613 and 615 are pattern elements 514, 513 and 515, respectively. The dimension of overlapped area between paired photomask pattern elements 514–513 or 514–515 is 0.4 $\mu$m, as described above. It can be therefore found in this case that the resist pattern is formed 0.4 $\mu$m smaller than the mask pattern.

As described above, the principle on which the method of evaluating a pattern is based is quite same in both embodiments in which the mask patterns shown in FIGS. 1 and 5 are used respectively. When the measure precision evaluating pattern of FIG. 5 is employed, however, it is easier to find a pair of pattern elements contacting each other without overlapping. The reason is as follows. All of pattern elements in FIG. 5 are of rectangular shape and sides of upper pattern elements are parallel to those of lower pattern elements. Therefore, sides of plural pattern elements are aligned on a line where pattern elements contact each other without overlapping. This will be described in more detail referring to FIG. 6. Viewing pattern elements pair 606–605 and 606–603 of which pattern elements contact each other without overlapping, it can be found that the lower side of upper pattern element 606 is aligned with upper sides of lower pattern elements 605 and 603 on a straight line, that the left side of upper pattern element 606 is aligned with the right side of lower pattern element 605 on a line, and that the right side of upper pattern element 606 is aligned with the left side of lower pattern element 603 on a line. When a pair of pattern elements contacting each other without overlapping is to be sought under a microscope, therefore, it may be enough only to find not contacted points of these pattern elements but the portion where sides of plural pattern elements are aligned on a line. This can be reliably achieved even when the microscope is loosely focused, and therefore becomes easier than finding a point where plural pattern elements contact each other.

It should be understood that the pattern whose measure precision can be evaluated according to the method of the present invention is not limited to the resist pattern. Even the etched pattern, for example, obtained by selectively etching the under-layer of photoresist layer using the formed photoresist pattern as a mask, can be evaluated of its measure precision according to the method of the present invention. In a case where the first photo-engraving process is intended to form a field insulating film and the second one is intended to form gate electrodes of polycrystalline silicon in the course of manufacturing a semiconductor device, measure precision may not be estimated with high accuracy when the etched pattern obtained by transcribing the measure precision evaluating pattern provided in the mask for forming gate electrodes is formed on the field insulating film, because the field insulating film is swelled and does not become same in level as gate electrode. It is preferable in this case that an area where the etched pattern for measure precision evaluation can be formed is prepared at the time of forming the field insulating film in addition to where gate electrode is to be formed in the second photo-engraving process, thereby forming the etched pattern for measure precision evaluation at the area same in level as that of gate electrodes at the time of forming the transcribed-etched pattern through the photomask in the second process. The evaluation of measure precision of gate electrodes can be thus achieved with high accuracy.

When an etched pattern is evaluated, the standard point of measure precision evaluating pattern formed in the photomask may be determined considering the difference caused in the course of etching process.

The shape of pattern elements employed in the photomask of the present invention is not limited to triangular and rectangular ones as described above but may be other ones. When the distance or the dimension of overlapped area between pattern elements is varied more finely than in above-described example, varied 0.1 μm with every paired pattern elements, for example, evaluation of measure precision can be achieved with higher accuracy.

The substrate suitable for the method of the present invention is not limited to the semiconductor wafer (including those having various kinds of insulating layers, electrode material layer and photoresist layer formed on the surface thereof), but may be a mask substrate and the like.

As described above, the present invention enables to measure the dimension of photoresist and etched patterns to be evaluated with easiness and with high accuracy without using such particular measuring device as SEM usually employed in conventional methods. This allows in-process monitoring to be achieved at the stage of forming photoresist and etched patterns. If it is found as the result of monitoring that the measure precision of pattern is bad, a semiconductor device of high quality can be manufactured by correcting its manufacturing parameters appropriately. When the photoresist pattern is bad, it is possible to remove the photoresist and to prepare a resist pattern again before etching, thus allowing the yield to be enhanced.

What we claim is:

1. A method of evaluating the measure precision of a pattern formed in a substrate comprising:
    (a) providing a photomask including a first measure precision evaluating pattern having a plurality of pairs of pattern elements, pattern elements of each pair being spaced a predetermined distance from each other and arranged opposite to each other, and a second measure precision evaluating pattern having a plurality of pairs of pattern elements, pattern elements of each pair being arranged opposite to each other and overlapped each other in a predetermined measure to form a constricted portion, said predetermined distance being varied with every pair of pattern elements and said predetermined measure of overlapped area between pattern elements being varied with every pair of pattern elements;
    (b) transcribing said measure precision evaluating patterns to a substrate; and
    (c) finding a pair of pattern elements formed in the substrate, which contact each other without overlapping to know the dimensional change from the distance or the measure of overlapped area between pattern elements in the photomask which correspond to said pair of pattern elements found.

2. The method according to claim 1 wherein said pattern elements constituting said first and second measure precision evaluating patterns are aligned in a line centering a pair of pattern elements contacting each other without overlapping, and said distance and said measure of overlapped area between pattern elements become larger as they become remoter and remoter from the center of said line.

3. The method according to claim 2 wherein the distance and the measure of overlapped area between pattern elements becomes equal to a value obtained by integrally multiplying its smallest distance or measure.

4. The method according to any one of claims 1 to 3 wherein said pair of pattern elements are arranged with their parallel sides adjacent to each other.

5. The method according to claim 4 wherein said pattern elements are rectangular.

6. The method according to claim 5 wherein the step of finding said pair of pattern elements contacting each other without overlapping is achieved by finding sides of plural pattern elements aligned on a line.

7. The method according to claim 1 wherein said pattern to be evaluated its measure precision is a photoresist pattern.

8. The method according to claim 1 wherein said pattern to be evaluated its measure precision is an etched pattern formed using the photoresist pattern as a mask.

9. The method according to claim 7 wherein said etched pattern is a gate electrode pattern for a semiconductor device.

10. The method according to claim 8 wherein said gate electrode pattern is formed using a second photomask after a field insulating film pattern is formed using a first photomask, said measure precision evaluating patterns are formed in said second photomask, and a pattern for forming an area which is same in level as that of said gate electrode and to which said measure precision evaluating patterns formed in said second photomask are to be transcribed is prepared in a region different from the pattern for forming said gate electrodes, and said measure precision evaluating pattern is formed in said area.

11. A photomask comprising:
a mask pattern for forming a desired pattern in a substrate;
a first measure precision evaluating pattern having a plurality of pairs of pattern elements spaced a predetermined distance from each other and arranged opposite to each other, said predetermined distance being varied with every pair of pattern elements; and
a second measure precision evaluating pattern having a plurality of pairs of pattern elements overlapped each other in a predetermined measure and arranged opposite to each other to form a constricted portion, said predetermined measure being varied with every pair of pattern elements.

12. The photomask according to claim 11 wherein said pattern elements constituting said first and second measure precision evaluating patterns are aligned in a line centering a pair of pattern elements contacting each other without overlapping, and said distance and said measure of overlapped area between pattern elements becoming larger as they become remoter and remoter from the center of said line.

13. The photomask according to claim 12 wherein said distance and said measure becomes equal to a value obtained by integrally multiplying its smallest distance or measure.

14. The photomask according to any one of claims 11 to 13 wherein said pair of pattern elements are arranged with their parallel sides adjacent to each other.

15. The photomask according to claim 14 wherein said pattern elements are rectangular.

* * * * *